United States Patent [19]
Gabillard et al.

[11] Patent Number: 5,267,216
[45] Date of Patent: Nov. 30, 1993

[54] BICMOS LOCAL ADDRESS TRANSITION DETECTION CIRCUIT

[75] Inventors: Bertrand Gabillard, Paris; Philippe Girard, Corbeil-Essonnes; Michel Grandguillot, Verrieres-Le Buisson, all of France

[73] Assignee: International Business Machines Corporation, Armonk, N.Y.

[21] Appl. No.: 920,086

[22] Filed: Jul. 27, 1992

[30] Foreign Application Priority Data

Jul. 31, 1991 [EP] European Pat. Off. ......... 91480122.0

[51] Int. Cl.$^5$ .............................................. G11C 8/00
[52] U.S. Cl. .............................. 365/233.5; 365/230.08; 307/355
[58] Field of Search ................... 365/233.5, 230.08; 307/355, 570, 452

[56] References Cited

U.S. PATENT DOCUMENTS

| | | | |
|---|---|---|---|
| 4,616,342 | 10/1986 | Miyamoto | 365/190 |
| 4,749,880 | 6/1988 | Kobatake | 307/355 |
| 4,897,820 | 1/1990 | Shiomi et al. | 365/230.08 |
| 4,922,122 | 5/1990 | Dubujet | 365/233.5 |
| 5,003,513 | 3/1991 | Porter | 365/230.08 |

FOREIGN PATENT DOCUMENTS 20337202 10/1989 European Pat. Off. .
20368328 5/1990 European Pat. Off. .

OTHER PUBLICATIONS

"Two 13-ns 64K CMOS SRAM's with Very Low Active Powder and Improved Asynchronous Circuit Techniques," S. T. Flannagan et al., IEEE Journal of Solid-State Circuits, vol. SC-21, No. 5, Oct. 1986, pp. 692-703.
"A 6-ns 256-Kbit BICMOS TTL Sram," T. Akioka et al., IEEE 1990 Custom Integrated Circuits Conf., Boston Mass., pp. 24.3.1-24.3.4.
"An 8-ns 1-Mbit ECL BiCMOS SRAM with Double-Latch ECL-to-CMOS-Level Converters," M. Matsui et al., IEEE Journal of Solid-State Circuits, vol. 24, No. 5, Oct. 1989, pp. 1226-1231.

*Primary Examiner*—Eugene R. LaRoche
*Assistant Examiner*—A. Zarabian
*Attorney, Agent, or Firm*—Lawrence H. Meier

[57] ABSTRACT

A plurality of local address transition detector (LATD) circuits, one per address bit signal (Ai), of the type used in SRAMs to generate an on-chip clock pulse (LATDSi) that insures a correct timing of internal circuits such as sense amplifiers and address decoders that are essential for a correct READ/WRITE operation of the SRAM. According to one aspect of the invention, each LATD circuit includes: a first bipolar transistor (T1) serially connected with a first FET device (N1) forming a first branch; a second bipolar transistor (T2) serially connected with a second FET device (N2) forming a second branch. The first and second branches are connected in parallel between a first supply voltage (Vcc) and a common output node (N) connected to a circuit output terminal (30-i) where the output signal (LATDSi) generated by the LATD circuit (22-i) is available. The first and second bipolar transistors (T1, T2) are respectively driven by the address signal (Ai') and its complement ($\overline{Ai'}$) at the ECL voltage levels and the second and first FET devices are respectively driven by the address signal (Ai*') and its complement ($\overline{Ai*'}$) at the CMOS voltage levels. As a result of this design of the LATD circuit, the delays in critical paths in BICMOS circuits incorporating the LATD circuit may be significantly reduced relative to BICMOS circuits utilizing conventional LATD circuits.

8 Claims, 3 Drawing Sheets

——— pure CMOS

BICMOS LOCAL ADDRESS TRANSITION DETECTION CIRCUIT

FIELD OF THE INVENTION

The present invention generally relates to logic circuits, and more particularly to a BiCMOS local address transition detection (LATD) circuit. Address transition detection is used in asynchronous Static Random Access Memories (SRAMs) to generate an on-chip clock pulse that insures a correct timing of certain internal circuits of the SRAM.

BACKGROUND OF THE INVENTION

FIG. 1 shows the general schematic block diagram of the architecture of a conventional asynchronous BiCMOS SRAM circuit 1 with which the LATD circuit of the present invention may be used. The SRAM circuit basically includes a mxp CMOS memory cell array identified by numeral 2, X (or row) and Y (or column) address decoder circuits respectively referenced 3 and 4, and the data transfer and sense amplifier circuits in block 5. The X decoder circuit 3 or word line (WL) selection circuit selects one word line in response to the X address word (addresses X1 to Xk). The Y decoder circuit 4 or bit line (BL) selection circuit selects one sense amplifier corresponding to one pair of bit lines in response to the Y address word (addresses Y1 to Y_). Conventionally, memory cell array 2 is constructed by a plurality of individual memory cells generically referenced MC arranged in a matrix. Typically, each of memory cells is of the 6-device type and comprises a flip-flop formed by a pair of cross-coupled NFETs loaded by resistors or PFETs and a pair of transfer gates consisting of NFETs. All memory cells of a same column are connected between a pair of bit lines, while all the memory cells of a same row are connected to the same word line. X and Y address bits are stored in respective individual address buffers or receivers arranged in two blocks referenced 6-A and 6-B. Typically, address buffer blocks 6-A and 6-B are part of a general address buffer block 6 which receives all the address bits A1 to An including both X and Y address bits as shown in FIG. 1. The selected sense amplifier in block 5 amplifies the signal that appears between the corresponding pair of bit lines and generates a signal that is representative of the binary data stored in the selected cell to output buffer 7. The data out (DO) signal is available at the output terminal 8 thereof.

SRAM circuit 1 further includes a control logic circuitry typically comprising two local address transition detection (LATD) circuits in blocks 9-A and 9-B, respectively corresponding to the X and Y address buffer blocks 6-A and 6-B, a main address transition detection (MATD) circuit 10 and a control logic circuit 11. Similarly, LATD blocks 9-A and 9-B are part of a general LATD block 9 which therefore comprises n individual LATD circuits, one for each address buffer or address bit. References are therefore given with correspondence therebetween, e.g., address bit Ai (i=1 to n) corresponds to address buffer 6-i and LATD circuit 9-i, the latter generating a pulse signal LATDSi.

Each LATD circuit detects a transition of the corresponding address bit signal. When a transition occurs, in at least one address bit, e.g., in bit Ai, the corresponding LATD circuit, e.g., LATD 9-i, outputs a local address transition detection signal, e.g., LATDSi of a determined width. MATD circuit 10 is basically an OR gate, since it makes the summation of all LATDS signals supplied by the n LATD circuits, i.e., signals LATDS1 to LATDSk originating from LATD block 9-A via bus 12-A and signals ATDSk+1 to ATDSn originating from LATD block 9-B via bus 12-B. MATD circuit 10 generates a signal referenced MATDS, that is applied to control circuit 11 via line 13. In turn, control circuit 11 controls operation of X decoder 3, Y decoder 4, and sense amplifier circuits in block 5, respectively, through control lines 14, 15 and 16. This technique is used to generate a pulsed word line signal that closes the transfer gates of the memory cells after a READ or a WRITE operation in order to avoid DC current consumption in the array when no cell is selected. Connection lines between address buffer block 6-A and X decoder 3 on the one hand, and between address buffer block 6-B and Y decoder 4 on the other hand, are respectively made through busses 17 and 18. Finally, the connection lines between Y decoder 4 and the sense amplifier block 5 are grouped in a bus referenced 19.

Typically, the SRAM circuit of FIG. 1 is constructed in the BiCMOS technology. CMOS device manufacturing methods have many processing steps that are compatible with bipolar device manufacturing methods. Recently, new methods have been developed to implement both CMOS and bipolar devices on the same chip to take benefit of their respective advantages, leading to the so-called BiCMOS technology. In particular, in SRAMs, the use of 6-device cells in CMOS technology presents many advantages in terms of integration density (which leads to highly integrated memory chips) and in improved manufacturing yields. On the other hand, in addition to their high switching speed, bipolar devices have a number of intrinsic advantages compared to CMOS devices when used in certain applications, such as in sense amplifiers. Bipolar devices are appreciated for their outstanding driving capabilities of capacitive loads due to their high current gain. Also, bipolar devices require smaller transitions on signal swings than CMOS devices. However, extensive usage of bipolar devices has been limited because of their large power dissipation. As a result, both bipolar devices (such as of the ECL type) and CMOS devices are simultaneously found in the same chip. A major concern is that the high and low voltage (or logic) levels in ECL circuits are different than those in CMOS circuits. For example, typical ECL circuits operate with standard high and low voltage levels of approximately −0.9 and −1.7 volts respectively, while typical CMOS circuits operate with high and low voltage levels of about −0.4 and −4.1 volts respectively. Therefore, in order to couple the output of an ECL circuit to the input of a CMOS circuit, a converting circuit is commonly employed to change the logic levels. For example, most of the BiCMOS stand-alone SRAM chips require converters with ECL compatible input voltage levels and CMOS compatible output voltage levels.

As illustrated by the conventional BiCMOS SRAM circuit of FIG. 1, basically the combination of a low power consumption, high density, CMOS memory cell array 2 with BiCMOS sense amplifiers and address decoders, provides an excellent compromise between density and speed in cost competitive SRAMs. Conventionally, in addition to the sense amplifiers and address decoders mentioned above, output buffer 7 and control logic circuit 11 are also BiCMOS circuits, while the circuits forming the LATD block 9, the address buffer block 6 and the MATD circuit 10 are pure CMOS circuits.

For example, with respect to the circuit of FIG. 1, a similar BiCMOS SRAM circuit architecture is illustrated in the article: "An 8-ns 1 Mbit ECL BiCMOS SRAM with double latch ECL to CMOS level converters" by M. Matsui et al published in IEEE JSSC (USA) vol. 24, N°5, October 1989, p 1226–1232. As apparent from FIG. 1 of this article, once the address signals X0–X8, Y0–Y10 at the ECL voltage levels have been converted in CMOS voltage levels by the ECL to CMOS converter, the remaining circuits in the address buffer block and the LATD block comprise pure CMOS circuits. In that respect, a detailed description of a pure CMOS LATD circuit is described in the article "Two 13-ns 64 K CMOS SRAM's with very low active power and improved asynchronous circuit techniques", by S. T. Flannagan et al., IEEE JSSC, vol. SC-21, N°5, Oct. 1986, pp 692–696

Because, there is a continuous attempt to improve performance in advanced high speed BiCMOS SRAM circuits, more attention has been given to LATD circuits. As these SRAM circuits reach the 10 ns access time range, the address transition detection role becomes more and more important. This function occurs in the critical delay path that allows a store or a sense (read) of the memory to occur once an address transition has been detected and is, therefore, determinative of the total access time.

Pure CMOS LATD circuits do not appear to have the potential to fulfill the high speed requirements that are now desired for the implementation of advanced high speed SRAM circuits for a number of reasons. First, CMOS circuits are intrinsically slow circuits because they require a delay corresponding to the time needed to make the transition of a threshold voltage (VT) to trigger a FET device. This point is illustrated by the LATD circuit described in the article by S. T. Flannagan et al. referenced above. As apparent from FIG. 3(a) of the Flannagan et al. article, the output signal generated by logic gate 3 drives an input circuit comprising a NFET and a PFET. The latter will enter in conduction only when said output signal becomes higher than its VT.

In addition, CMOS circuits tend to be slow because they generally deliver full swing output voltages, which take more time for delivery, as compared with bipolar circuits that supply small swing output voltages. This characteristic is also illustrated in FIG. 3(a) of the Flannagan et al. article, where logic gate 3 generates a full swing logic signal to the LATD circuit, which, in turn, also delivers a full swing output signal. Moreover, conventional SRAM circuits such as shown in the Matsui et al. article discussed above, require that the ECL to CMOS conversion be completely terminated before the address bit signal at the CMOS levels is applied to the corresponding LATD circuit. This again slows down the signal transmission to the address buffer.

Finally, many known implementations of LATD circuits include PFETs. For example, with respect to the LATD circuit illustrated in the Flannagan et al. article two PFETs are connected in series in each branch to achieve the pull-up effect. PFETs are known to be slow devices.

SUMMARY OF THE INVENTION

It is therefore the primary object of the present invention to provide a fast BiCMOS local address transition detection circuit to significantly reduce the delays in critical paths in advanced high speed BiCMOS SRAM circuits.

The above object is achieved by a BiCMOS LATD circuit that generates a signal of a determined width.

The circuit includes a first bipolar transistor serially connected with a first FET device forming a first branch and a second bipolar transistor serially connected with a second FET device forming a second branch. The first and second branches are connected in parallel between a first supply voltage and a common output node connected to a circuit output terminal where the output signal generated by the LATD circuit is available. The first and second bipolar transistors are respectively driven by the true and complement address signals at ECL voltage levels forming a first pair of signals and the first and second FET devices are respectively driven by the complement and true address signals at CMOS voltage levels forming a second pair of signals.

The BiCMOS LATD circuit also includes a stand-by circuit connected between the common output node and a second supply voltage, a pull-down circuit connected between the common output node and the second supply voltage, and a delay line and amplifying circuit connected to the common output node and driving the pull-down circuit to reset the potential of the common output node when the output signal has been generated.

In a preferred embodiment, these two pairs of signals are generated by a BiCMOS address buffer which consists of three stages: an ECL receiver generating said first pair of signals at the ECL levels, a voltage translator driven by said ECL receiver, and two output drivers forming the final output stage for generating the other pair of signals at the CMOS levels.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings wherein:

DETAILED DESCRIPTION OF THE INVENTION

The LATD circuit of the present invention requires input signals both at the ECL voltage levels and at the CMOS voltage levels. As a result, any ECL to CMOS converter or address buffer which provides the true and complement signals at both ECL and CMOS voltage levels would be appropriate. For example, either of the two implementations of the ECL to CMOS BiCMOS three-stage input buffer described in patent application EP-A-91480034.7 filed on 28 Feb. 1991 and assigned to the same assignee as of the present invention can be employed. This application is incorporated herein by reference. However, the preferred implementation is the one which supplies CMOS voltage levels with small (or reduced) voltage swings. This preferred implementation will be briefly detailed later in conjunction with FIG. 3.

Figure 1:
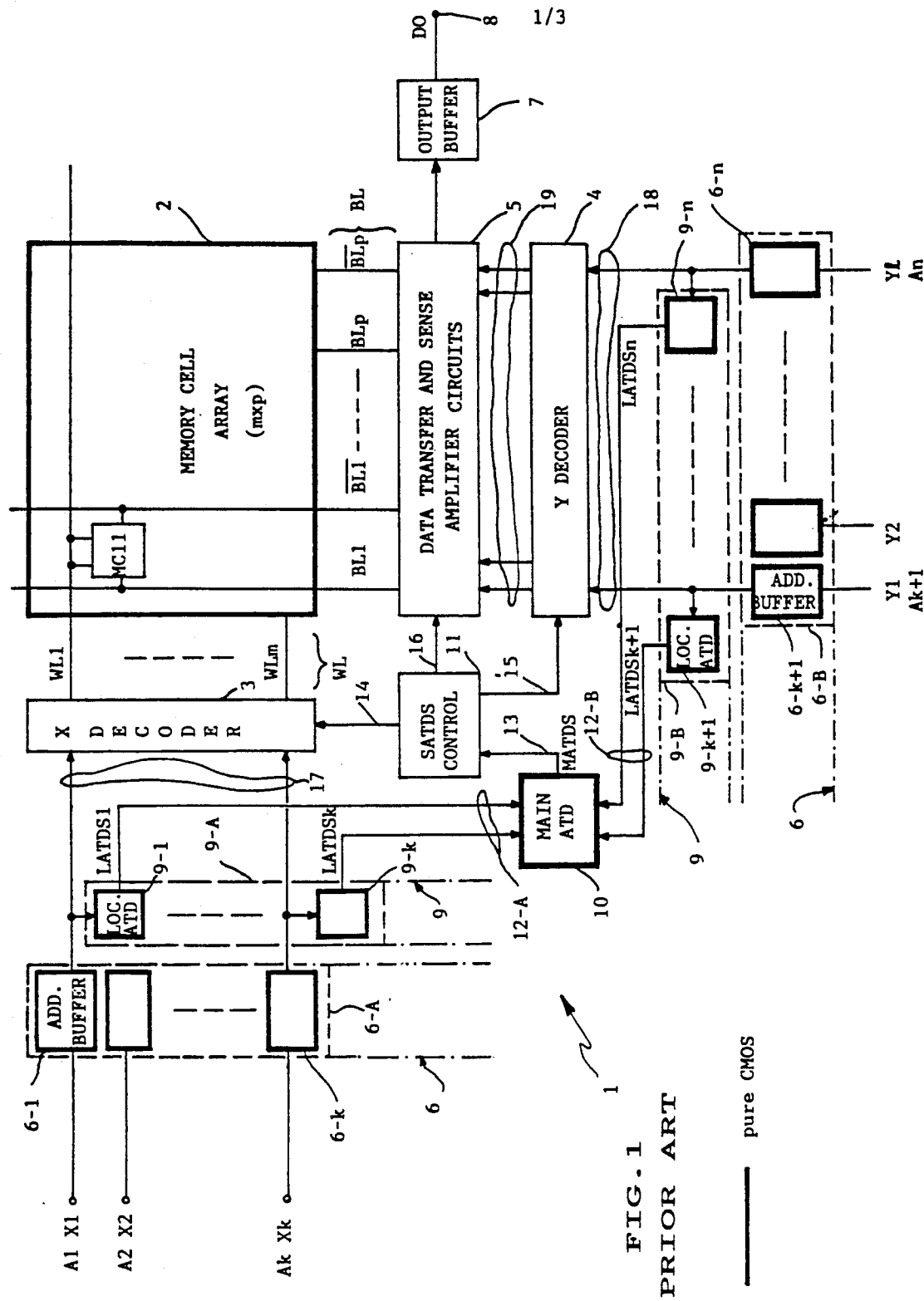
FIG. 1 is a schematic block diagram of a conventional BiCMOS SRAM circuit with which the present invention may be used.
Figure 2:
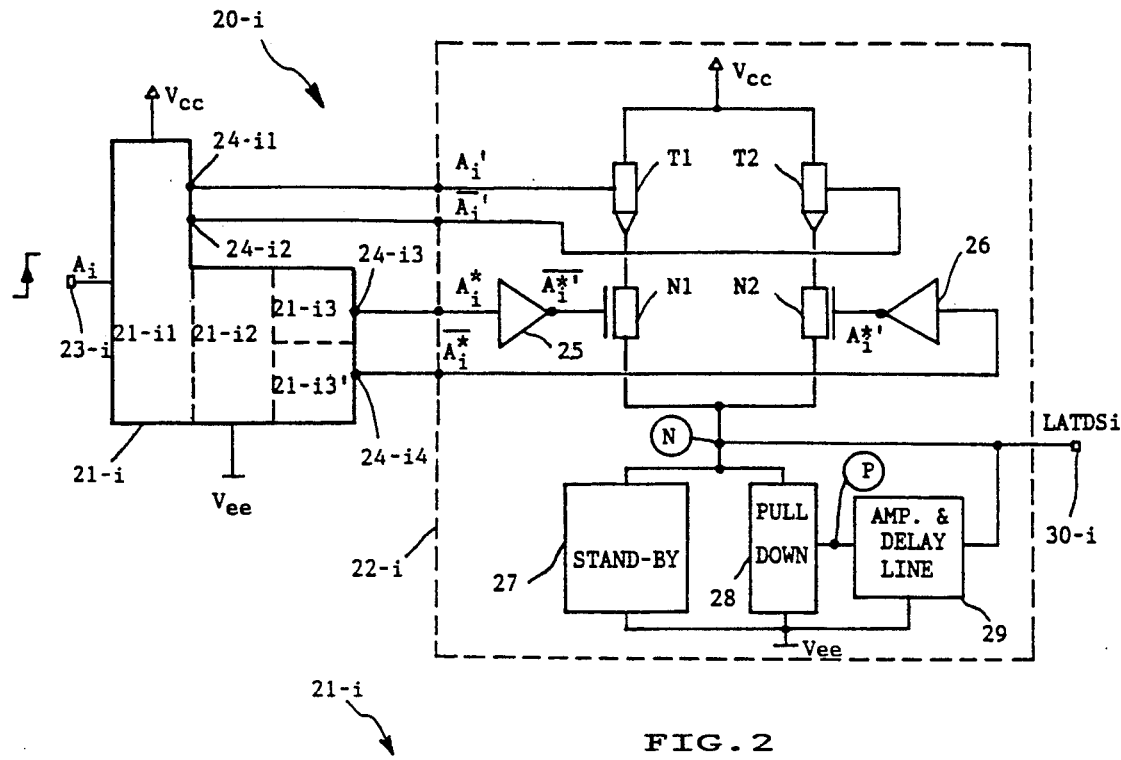
FIG. 2 is a schematic circuit diagram that shows the combination of a BiCMOS address buffer with the BiCMOS LATD circuit of the present invention for address bit Ai, which circuit generates the LATDSi signal.

FIG. 2 schematically illustrates the circuit combination 20-i formed by three-stage address buffer 21-i and the innovative LATD circuit 22-i of the present invention. This circuit combination is designed to replace the address buffer 6-i and LATD circuit 9-i in CMOS technology shown in the prior art circuit of FIG. 1.

Address bit signal Ai is applied to input terminal 23-i of address buffer 21-i at the ECL voltage levels. Basically, address buffer 21-i comprises three stages: an ECL receiver 21-i1, a voltage translator 21-i2 and an output driving stage, which in turn is comprised of two output drivers 21-i3 and 21-i3', one for each phase. The ECL receiver 21-i1 generates the true and complement signals Ai' and $\overline{Ai}'$ at the ECL like (or compatible) voltage levels in response to the address signal Ai at the ECL voltage levels. In accordance with the present invention, these signals are not only internally used for the translator 21-i2 but also externally used to directly drive the LATD circuit 22-i. Output drivers 21-i3 and 21-i3' supply the true and complement address signal Ai* and $\overline{Ai}*$ at the CMOS voltage levels as indicated by the asterisks respectively. The address buffer 21-i is biased between the first and the second supply voltages respectively Vcc (typically the ground) and Vee (typically $-5.2$ V). The first pair of signals Ai' and $\overline{Ai}'$ is delivered at output terminals referenced 24-i1 and 24-i2 and the second pair of signals Ai* and $\overline{Ai}*$ is delivered at output terminals 24-i3 and 24-i4, respectively.

The LATD circuit 22-i essentially consists of two branches connected between said first supply voltage Vcc and a common output node N. The first branch comprises a bipolar transistor T1 and a NFET N1 connected in series. The base electrode of T1 is driven by signal Ai' and the gate electrode of N1 is driven by signal $\overline{Ai}*'$. Similarly in the second branch, bipolar transistor T2 is connected in series with NFET N2. The base electrode of T2 is driven by signal $\overline{Ai}'$ and the gate electrode of N2 is driven by signal Ai*'. Collectors of bipolar transistors T1 and T2 are tied to Vcc. Signals Ai*' and $\overline{Ai}*'$ logically correspond to signals Ai* and $\overline{Ai}*$ but are delayed therefrom by said inverting buffers 25 and 26. Inverting buffers 25 and 26 generate said signals $\overline{Ai}*$ ' and Ai*' from original signals Ai* and $\overline{Ai}*$, respectively. Inverting buffers 25 and 26 are optional but can be useful to insure respective NFETs N1 and N2 are cut-off once node N has reached the desired maximum value. Should no inverting buffer or an even number thereof be required, signals Ai* and $\overline{Ai}*$ or Ai*' and $\overline{Ai}*'$, should be applied to the gate electrodes of NFETs N2 and N1, respectively.

The source regions of NFETs N1 and N2 are tied together at node N. A stand-by circuit 27 and a pull-down circuit 28 are connected between node N and said second supply voltage Vee. A delay line and amplifying circuit 29 whose input is tied to node N drives said pull down circuit 28. Node N is connected to circuit output terminal 30-i where the output signal LATDSi generated by LATD circuit 22-i is available. According to the present invention, LATD circuit 22-i is not only driven by the Ai* and $\overline{Ai}*$ signals (or derivative signals Ai*' and $\overline{Ai}*'$), at the CMOS voltage levels, but also by signals Ai' and $\overline{Ai}'$ at the ECL like levels, the latter signals being internally generated by the ECL receiver stage 21-i1 of the address buffer 21-i.

In operation, circuit 22-i functions in the following manner. Bipolar transistors T1 and T2 respectively drive NFETs N1 and N2. Devices T1 and N1 on the one hand, and devices T2 and N2 on the other hand, form two independent pull-up circuits that work alternately depending on the direction of the input transition (up-going or down-going) of address bit signal Ai that is applied on input terminal 23-i of address buffer 21-i. In the quiescent state, the potential of node N is determined by stand-by circuit 27, which is one Vbe above Vee. When one branch is cut, the other branch will be slightly conductive, thereby supplying the necessary bias current to the stand-by circuit. The pull-down circuit is cut off, since it is in a high impedance state.

For example, assuming address signal Ai is at the low ECL level, signals Ai' and Ai* are low as being the in-phase signals generated by address buffer 21-i, respectively at the ECL like levels and at the CMOS levels. As a result, NFET N1 is conductive, transistor T1 is slightly conductive, so that a limited current flows in the first branch. On the contrary, no current flows in the second branch because NFET N2 is cut off.

Now assuming an up-going transition of signal Ai is applied to terminal 23-i, transistor T1 is rendered highly conductive, while transistor T2 is cut off. The potential at node N rises until it reaches Vcc-Vbe(T1)-VT(N1), which is the maximum value. Potential at node N responds very quickly to the up-going transition, should the first stage forming the ECL receiver 21-i1 be formed by bipolar transistors mounted in an emitter-follower configuration, as is the case for the circuits referred to in EP-A-91480034.7 mentioned above. After a short delay due to transmission in the second and third stages of the address buffer 21-i (and optionally through inverting buffers 25 and 26), signal Ai*' and $\overline{Ai}*'$ are applied to the gate electrodes of NFETs N2 and N1 respectively. At the end of the up-going transition NFET N1 is cut-off, while NFET N2 is rendered conductive. The previous pull-up effect through devices T1 and N1 is stopped, and the potential of node N is maintained at the maximum value mentioned above should no activation of the pull-down circuit 28 arise. But, the increasing potential at node N is also fed into the delay line and amplifying circuit 29, in such a way to activate the pull-down circuit 28 after a determined delay because of the delay chain contained therein. Once activated, pull-down circuit 28 causes the potential of node N to fall sharply. A loop effect is then made through circuits 28 and 29 until circuit 28 is fully cut-off. The stand-by circuit 27 is then activated again, to clamp the potential of node N at one Vbe above Vee, i.e., the minimum potential value of node N. The role of stand-by circuit 27 is to insure a low potential level on node N in the quiescent state. As a result, a LATDSi pulse with a well calibrated width is obtained at output terminal 30-i. The same reasoning applies for a down-going transition.

In summary, after node N is pulled up by one of the two branches after a determined delay, it is rapidly reset to the quiescent state by circuit 29 which temporarily activates the pull-down circuit 28. Once the pull-down circuit 28 is deactivated at the termination of the LATDSi pulse, the stand-by circuit 27 maintains the quiescent current in the selected branch.

Figure 3:
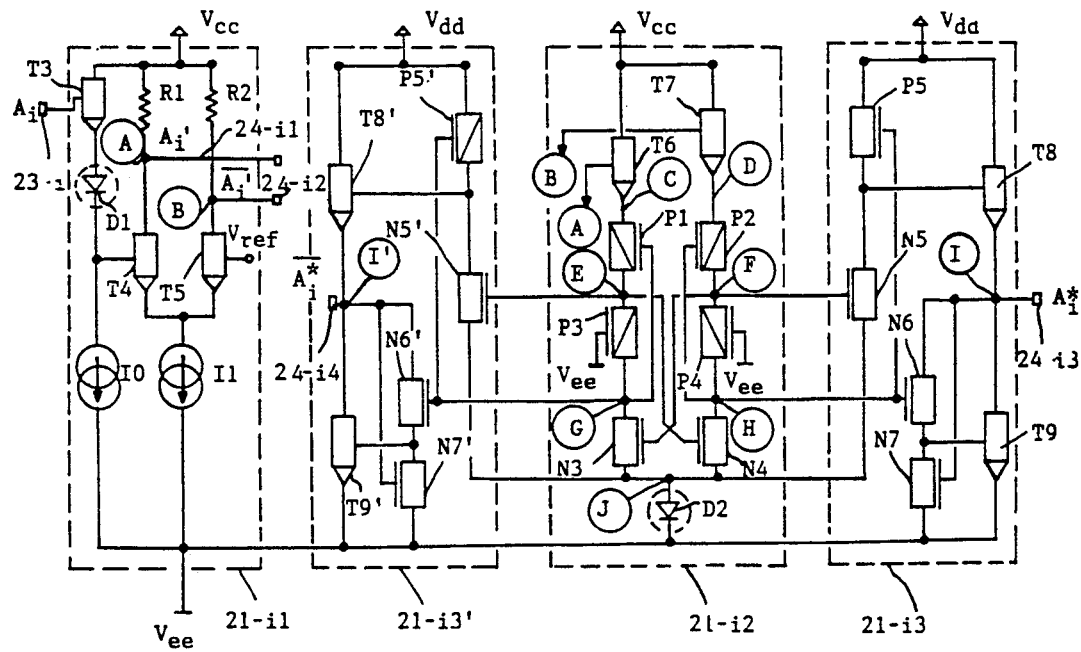
FIG. 3 is a circuit diagram of an address buffer in BiCMOS technology which can be used to generate the appropriate address bit signals in both ECL and CMOS voltage levels that are appropriate to drive the BiCMOS LATD circuit of the present invention.

The preferred implementation of the ECL to CMOS BiCMOS converter or address buffer 21-i, as disclosed in the previously mentioned European patent application, is shown in FIG. 3. As apparent from FIG. 3, at input terminal 23-i, the input address signal Ai at the ECL voltage levels is received and converted into output address signals Ai* and $\overline{Ai}$* at the CMOS voltage levels. Basically, the input address buffer 21-i is biased between said first and second supply voltages (Vcc, Vee) and comprises three stages. In addition, a third supply voltage Vdd can be used to enhance performance, as will be discussed later on. The first stage 21-i1 delivers output signals Ai' and $\overline{Ai}$' at the ECL like levels, for both internal and external usages. The second stage consists of a level-shifter or translator circuit 21-i2 which supplies two pairs of intermediate output signals for each phase, each pair driving an output driver. These output drivers, referenced 21-i3 and 21-i3', form the third stage.

The first stage 21-i1 consists of a conventional emitter-follower formed by bipolar transistor T3 with current source I0 and a current-switch comprised of bipolar transistors T4 and T5 loaded by respective resistors R1 and R2. The emitters of T4 and T5 are dotted and connected to current source I1, as standard. The base electrode of transistor T5 is connected to a reference voltage Vref. The input address signal Ai at the ECL levels is applied to the base of the emitter-follower transistor T3 at input terminal 23-i. The output signals Ai' and $\overline{Ai}$' at the ECL like levels are obtained at nodes A and B which respectively correspond to terminals 24-i1 and 24-i2.

The level-shifter circuit 21-i2 comprises two NPN bipolar transistors T6 and T7, each connected in an emitter-follower configuration forming two branches. The base electrode of T6 is connected to node A and the base electrode of T7 is connected to node B. In each branch, the emitter load consists of three FET devices: two PFETs and one NFET serially connected, respectively referenced P1, P3 and N3 in the first branch and P2, P4 and N4 in the second branch. In the first branch, a common node E exists between the two adjacent PFETs P1 and P3. Node E is cross-coupled to the gate electrode of the NFET N4 of the other branch. In the same first branch the gate electrode of PFET P1, which is connected to the emitter of the bipolar transistor T6, is driven by the potential of the common node G formed by NFET N3 and PFET P3. The potentials of said common nodes E and G are used to drive output driver 21-i3'. Similar reasoning applies to the other branch to define common nodes F and H, whose potentials drive output driver 21-i3.

Output drivers 21-i3 and 21-i3' are relatively conventional BiCMOS circuits, except that the gate electrodes of the input FET devices are not tied to the same node as standard, but to two nodes of the level-shifter circuit, as discussed above, to further improve the overall input buffer performance. For example, output driver 21-i3 comprises two bipolar transistors T8 and T9 driven by a few FET devices. Top transistor T8 is driven by NFET N5 whose gate is connected to node F and by PFET P5 whose gate electrode is connected to node H. On the other hand, bottom transistor T9 is driven by NFET N6 whose gate electrode is connected to node H and by NFET N7 whose gate electrode is connected to circuit common output node I and then to circuit output terminal 24-i3. Output driver 21-i3' has an identical hardware construction, but PFET P5' is driven by the potential of node G and gate electrodes of NFETs N5' and N6' are respectively connected to nodes E and G.

The input address buffer of FIG. 3 is well suited for technologies where FET devices cannot withstand ECL voltage supplies, and therefore delivers relatively small or reduced swing output signals Ai* and $\overline{Ai}$* at the CMOS levels at terminals 24-i3 and 24-i4. As apparent from FIG. 3, output drivers 21-i3 and 21-i3' need the use of a third supply voltage Vdd (between −0.5 Volts and −2.5 Volts, typically Vdd = −1.5 Volts). However, this power supply is the same as the one already used in the chip for the internal CMOS circuit blocks. Because CMOS circuit blocks always use the Vdd power supply, the latter cannot be considered as an additional power supply. However, the address buffer of FIG. 3 would still remain operative should the third power supply not exist on the chip. This technique of using dual supply voltages, (one external at Vee = −5.2 Volts (for ECL 100K standard) and one internal at Vdd = −1.5 Volts) will likely be used with increasing frequency in large BiCMOS SRAM chips where CMOS devices cannot withstand ECL power supplies. As a result, the output signals Ai* and $\overline{Ai}$* at the CMOS levels generated by the address buffer have a reduced voltage swing.

The circuit of FIG. 3 is provided with two extra diodes to adjust the voltage levels. As shown in FIG. 3, diode D1 increases the voltage swing on resistors R1 and R2, so that saturation of bipolar transistors T4 and T5 is prevented. Diode D2 is connected to the common node J of NFETs N3 and N4 in the level-shifter circuit 21-i2 and centers the signals that are applied to the output drivers 21-i3 and 21-i3'.

Figure 4:
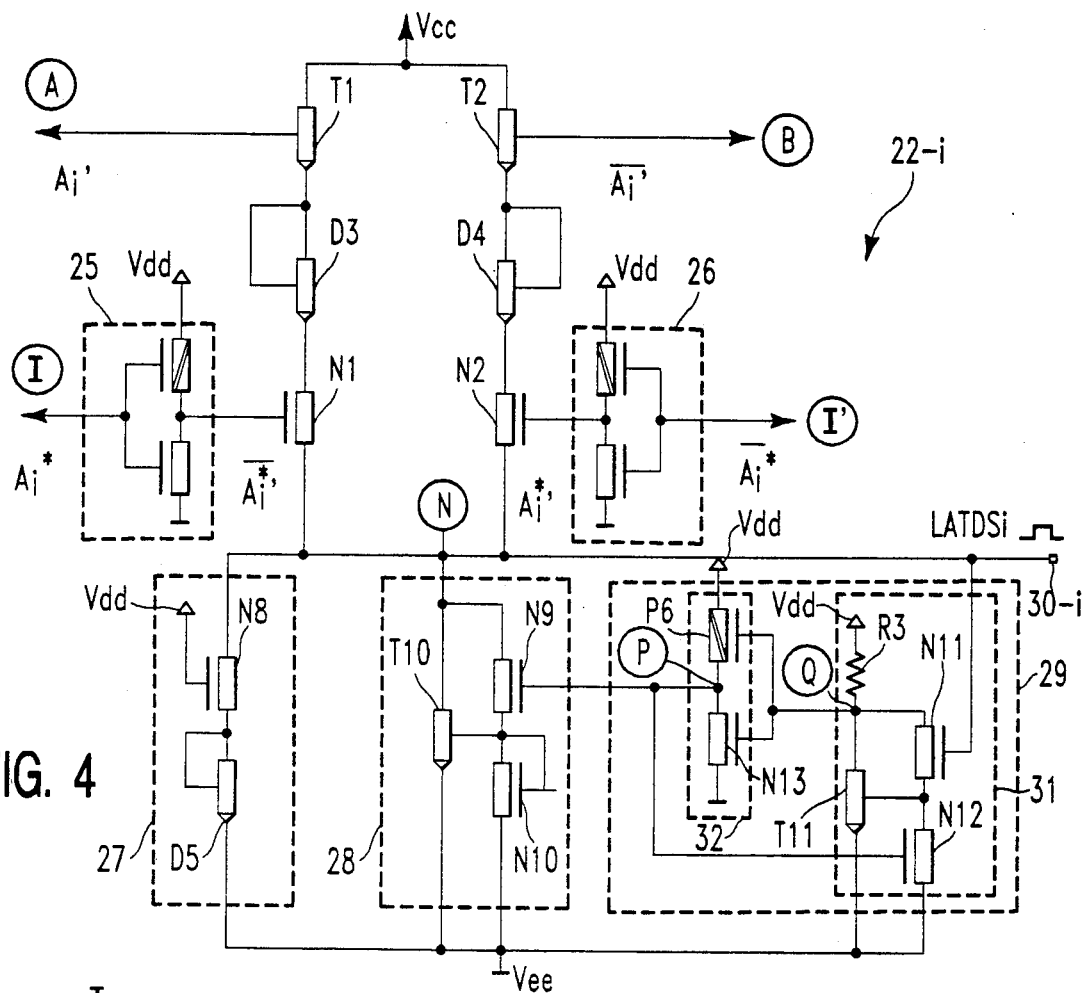
FIG. 4 is a detailed circuit implementation of the BiCMOS LATD circuit of FIG. 2, according to a preferred embodiment of the present invention.

A detailed implementation of the schematic block diagram of the LATD circuit 22-i of FIG. 2 is illustrated in FIG. 4. With respect to the circuit of FIG. 2, diode-connected NPN transistors D3 and D4 have been added in first and second branches respectively to limit the output voltage swing to the necessary maximum value. Each of said optional inverting buffers 25 and 26, simply consist of one CMOS inverter that drives the gate electrodes of NFETs N1 and N2. Stand-by circuit 27 is made of a diode-connected transistor D5 that insures a low level potential on node N in the quiescent state, equal to one Vbe, and a NFET N8 that limits the current flowing into this path when the potential of node N (and thus the output signal LATDSi) is rising. Pull-down circuit 28 is used to reset the LATD signal pulse to the low level. Circuit 28 is made of two NFETs N9 and N10 and a NPN transistor T10. NFET N10 resets the base of transistor T10. NFET N9, connected in parallel with the collector-base junction of transistor T10, is driven by the signal generated by the delay line and amplifying circuit 29. Circuit 29 is made of a BiCMOS amplifier stage 31 followed by at least one CMOS inverter 32. Circuit 29 ensures the loops effect with a delay line, whose delay is determined by the number of inverters (32-1, 32-2, ...) contained therein. The amplifier stage 31 comprises a NPN transistor T11 that has its emitter tied to Vee and its collector tied to a resistor R3 with pull-up node Q connected therebetween. The other end of resistor R3 is connected to Vdd. A NFET N11 with its gate electrode driven by output signal LATDSi is connected between the collector and the base of said NPN transistor T11. In the quiescent state, NFET N11 is turned off because its gate to source voltage is too small. Another NFET N12 is connected between the base of NPN transistor T11 and Vee, its role being to discharge the base of transistor T11. The gate electrode of NFET N12 is driven by the potential of node P formed at the common node of CMOS inverter 32. CMOS inverter 32 comprises devices P6 and N13.

Figure 5:
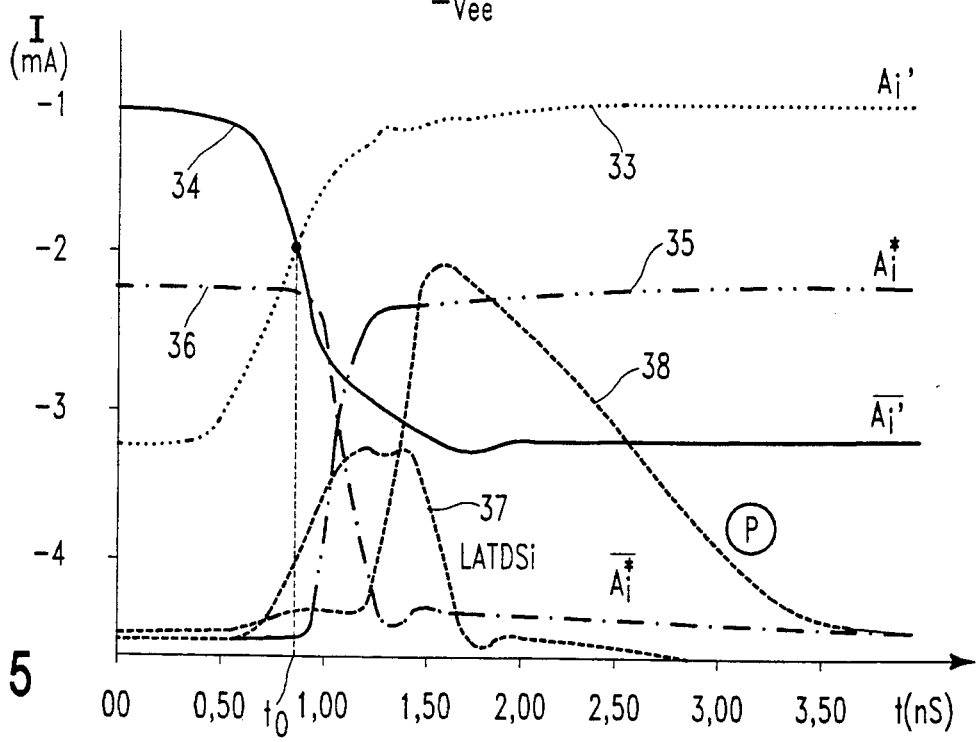
FIG. 5 is a timing chart showing typical signal waveforms at various nodes/terminals of the LATD circuit of FIG. 4.

The operation of circuit 22-i of FIG. 4 will be better understood when considered in light of the timing waveforms shown in FIG. 5.

FIG. 5 gives an example of the generation of the pulse-shaped output signal LATDSi at terminal 30-i in response to a given transition on terminal 23-i, indicating a change in address signal Ai. The same analysis can be given for the other transition which results in the same output signal because the behavior of the BiCMOS LATD circuit 22-i is the same except in that it is not the same branch that realizes the pull-up of output node N. In the example of FIG. 5, it is assumed that address signal Ai experiences an up-going transition. This up-going transition produces an up-going transition of output signals Ai′ and Ai*, and therefore a down-going transition on respective complementary output signals $\overline{Ai}′$ and $\overline{Ai}$* generated by address buffer 21-i.

In FIG. 5, output signals Ai′ and $\overline{Ai}′$ at the ECL like levels are illustrated by curves referenced 33 and 34 respectively, while the curves corresponding to output signals Ai* and $\overline{Ai}$* at the CMOS voltage levels are referenced 35 and 36. Curves 37 and 38 respectively illustrate output signal LATDSi and the potential variation at node P.

In the quiescent state, NFET N2 in the second branch is cut-off because signal $\overline{Ai}$* (curve 36) is high. In the other branch, NFET N1 is in a conductive state because signal Ai* (curve 35) is low. Signal $\overline{Ai}′$ (curve 34) is high and therefore signal Ai′ (curve 33) is low. In the quiescent state, the potential of node N is set to one Vbe above Vee through NFET N8 and diode D5, thereby insuring a small biasing current in the first branch through NFET N1. Circuit 29 is deactivated, resistor R3 insures a high potential level on node Q, which in turn, implies a low level on node P. NFET N9 is cut-off and thus transistor T10 of the pull-down circuit 28 is also cut-off.

When signal Ai′ (curve 33) rises, node N is pulled up through devices T1, D3 and N1 as in a conventional emitter-follower stage, but the output voltage swing is limited by the voltage drop into the first branch and is equal to: two Vbe's (i.e., (Vbe(T1)+Vbe(D3))) plus one NFET threshold voltage (i.e. VT(N1)). Soon after, NFET N1 is turned off by the up-going transition of signal Ai* coming out of address buffer 21-i. Node N stays at a high potential until it is reset by the pull-down circuit 28. Meanwhile, circuit 29 amplifies and delays the output signal LATDSi pulse, as illustrated by curve 37 which presents a sharp rising edge at node P (curve 38) that turns on NFET N9. The output node N is then rapidly discharged by transistor T10 of pull-down circuit 28. This voltage decrease turns off the delay chain of circuit 29. Accordingly, the output pulse swing of signal LATDSi is thus appropriately calibrated to drive the main ATD circuit 10 of FIG. 1.

The other branch comprising devices T2, D4 and N2 is not active because at the beginning of the up-going transition of signal Ai′, NFET N2 was turned off. After signal $\overline{Ai}′$ is pulled down, NFET N2 is turned on by signal $\overline{Ai}$*. Signal $\overline{Ai}′$ is too low to pull-up the potential of node N. The second branch delivers the necessary current to bias the stand-by circuit 27 in the quiescent state in preparation for the next transition.

In summary, the main characteristics of the LATD circuit 22-i of FIG. 4 are:

LATD circuit 22-i is very fast because it uses an emitter-follower stage (T1+N1 or T2+N2) to speed up the first up-going transition of signal LATDSi as apparent from curve 37. In addition, it uses the signal directly at the outputs 24-i1 and 24-i2 of the ECL receiver stage 21-i1 of address buffer 21-i and not after conversion to CMOS levels. In other words, LATD circuit 22-i does not have to wait for the full end of the conversion. As a result, LATD circuit 22-i generates a pulse LATDSi that immediately follows the transition of the input address signal Ai. Moreover, with the circuit of FIG. 4, output signal LATDSi is not necessarily a full swing CMOS signal. It is known that a small signal swing or amplitude improves the circuit speed. The down-level is insured by the stand-by circuit 27, the up-level is determined by the high level on nodes A (or B) minus the two Vbe's drop into T1 and D3 (or T2 and D4) and minus a VT drop into N1 (or N2). Typically, this whole voltage drop is in the range of 2.2–2.4 Volts.

The quiescent current of LATD circuit 22-i is practically equal to zero. For that reason, LATD circuit 22-i is well suited for high density RAMs which have an ever increasing number of inputs, for example 22 inputs for a 1 Mb SRAM, including address, chip select ($\overline{CS}$), and write enable ($\overline{WE}$)inputs.

Because LATD circuit 22-i makes extensive use of CMOS devices, its power consumption is low.

Because of the usage of NPN transistors, LATD circuit 22-i is fully capable of driving the line connected to terminal 30-i, even if this line is heavily loaded (for instance by a several millimeters long wire).

The principle of this LATD circuit can be easily adapted to other voltage values, both in terms of supply voltages and voltage swings.

LATD circuit 22-i generates a well calibrated width pulse, whose width is adjustable by selecting the number of inverters 32 in the delay chain of circuit 29.

As apparent from FIG. 5, the typical simulated results for a 1 Mbit BiCMOS SRAM circuit with LATD circuit 22-1 of the present invention are:

| | |
|---|---|
| Delay between address signal Ai change and LATDSi rising transition | 0.5 ns |
| LATDSi pulse width | 0.7 ns |
| LATDSi pulse swing | 1.5 V |
| Power dissipation | 0.2 mW (at 10 ns cycle) |

What is claimed is:

1. A LATD circuit for detecting the transition of an address signal between high and low states and for providing a transition signal upon detection of such transition, the circuit being designed for use with an address buffer (1) for generating first and second signals at first voltage levels in response to receipt of the address signal, the second signal being the complement of the first signal, and (2) for generating third and fourth signals at second voltage levels in response to receipt of the address signal, the fourth signal being the complement of the third signal, the LATD circuit comprising:

a first bipolar transistor serially connected with a first FET so as to form a first branch and a second bipolar transistor serially connected with a second FET so as to form a second branch, said first and second branches being connected in parallel so as to be coupled at first and second nodes, wherein said first and second bipolar transistors and said first and second FETs are connectable to the address buffer so as to permit (1) the first signal to drive said first bipolar transistor, (2) the second signal to drive said second bipolar transistor, (3) the third signal to drive said first FET, and (4) the fourth signal to drive said second FET;

a stand-by circuit connected to said first and second branches at said second node for maintaining a predetermined potential at said second node when said stand-by circuit is activated;

a pull-down circuit connected to said second node for decreasing the potential at said second node when said pull-down circuit is activated; and an amplifier and delay circuit connected to said second node, to said stand-by circuit, and to said pull-down circuit for selectively activating said stand-by circuit and said pull-down circuit so that an address transition signal of predetermined amplitude and period is provided at said second node in response to the transition of the address signal between high and low states.

2. A LATD circuit according to claim 1, wherein said stand-by circuit includes a FET connected in series with a diode.

3. A LATD circuit according to claim 1, wherein said pull-down circuit includes a bipolar transistor connected in parallel with a pair of series-connected FETs.

4. A LATD circuit according to claim 1, wherein said amplifier and delay circuit comprises an amplifier connected in series with at least one inverter.

5. A LATD circuit according to claim 1, further comprising a first inverting buffer connected between said address buffer and said first FET for generating the complement of the third signal and a second inverting buffer connected between the address buffer and said second FET for generating the complement of the fourth signal.

6. A BiCMOS static random access memory circuit comprising:

a memory cell array including a plurality of static memory cells arranged in a matrix form;

a plurality of word lines, each coupled with a respective row of said memory cells, for accessing a selected row of said memory cells;

a plurality of bit line pairs, each pair coupled with a corresponding one of said memory cells, for transferring data from said memory cells;

an address buffer (1) for generating first and second signals at first voltage levels in response to receipt of an address signal, the second signal being the complement of the first signal, and (2) for generating third and fourth signals at second voltage levels in response to receipt of the address signal, the fourth signal being the complement of the third signal;

at least one LATD circuit for detecting the transition of the address signal between high and low states and for providing a transition signal upon detection of such transition, said at least one LATD circuit including:

(1) a first bipolar transistor serially connected with a first FET so as to form a first branch and a second bipolar transistor serially connected with a second FET so as to form a second branch, said first and second branches being connected in parallel so as to be coupled at first and second nodes, wherein said first and second bipolar transistors and said first and second FETs are connected to said address buffer so as to permit (1) the first signal to drive said first bipolar transistor, (2) the second signal to drive said second bipolar transistor, (3) the third signal to drive said first FET, and (4) the fourth signal to drive said second FET;

(2) a stand-by circuit connected to said first and second branches at said second node for maintaining a predetermined potential at said second node when said stand-by circuit is activated;

(3) a pull-down circuit connected to said second node for decreasing the potential at said second node when said pull-down circuit is activated; and (4) an amplifier and delay circuit connected to said second node, to said stand-by circuit, and to said pull-down circuit for selectively activating said stand-by circuit and said pull-down circuit so that an address transition signal of predetermined amplitude and period is provided at said second node in response to a transition of the address signal between high and low states.

7. A BiCMOS circuit according to claim 6, further comprising control means for initializing the potentials of said plurality of bit line pairs in synchronism with said address transition signal.

8. A BiCMOS circuit according to claim 6, wherein said at least one LATD circuit comprises a plurality of LATD circuits, further wherein said BiCMOS circuit includes main address transition detection means coupled with said plurality of LATD circuits and said control means for combining address transition signals provided by each of said plurality of LATDs so as to generate a main signal that is used to control the operation of said control means.

* * * * *